(12) United States Patent
Cui (10) Patent No.: US 11,703,839 B2
(45) Date of Patent: Jul. 18, 2023

(54) MATERIAL PROCESSING PATH SELECTION METHOD AND DEVICE

(71) Applicant: BEIJING NAURA MICROELECTRONICS EQUIPMENT CO., LTD., Beijing (CN)

(72) Inventor: Lin Cui, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 0 days.

(21) Appl. No.: 17/687,388

(22) Filed: Mar. 4, 2022

(65) Prior Publication Data
US 2022/0187807 A1 Jun. 16, 2022

Related U.S. Application Data

(63) Continuation of application No. PCT/CN2020/110409, filed on Aug. 21, 2020.

(30) Foreign Application Priority Data

Sep. 6, 2019 (CN) .......................... 201910843955.6

(51) Int. Cl.
 *G05B 19/418* (2006.01)
 *B08B 13/00* (2006.01)
 *H01L 21/677* (2006.01)

(52) U.S. Cl.
 CPC ........ *G05B 19/41865* (2013.01); *B08B 13/00* (2013.01); *G05B 2219/32252* (2013.01); *H01L 21/67739* (2013.01)

(58) Field of Classification Search
 CPC .... G05B 19/41865; G05B 2219/32252; G05B 2219/45026; B08B 13/00; H01L 21/67739; H01L 21/67276; G06Q 10/0631; G06Q 50/04
 See application file for complete search history.

(56) References Cited

FOREIGN PATENT DOCUMENTS

| AU | 1164088 A | 8/1988 |
|---|---|---|
| CN | 101226870 A | 7/2008 |
| CN | 102789598 A | 11/2012 |

(Continued)

OTHER PUBLICATIONS

The World Intellectual Property Organization (WIPO) International Search Report for PCT/CN2020/110409 dated Nov. 24, 2020 7 Pages (with translation).

*Primary Examiner* — Tejal Gami
(74) *Attorney, Agent, or Firm* — Anova Law Group, PLLC (57) ABSTRACT

A material processing path selection method includes calculating a plurality of candidate material processing paths, determining a bottleneck process tank, and for each of the plurality of candidate material processing paths, calculating a bottleneck process tank utilization rate to select a candidate material processing path with a highest bottleneck process tank utilization rate in the plurality of candidate material processing paths as a target material processing path. The bottleneck process tank is a process tank having a highest use frequency among all process tanks, A use frequency of the process tank is equal to a total process time length of all materials that need to be transferred to the process tank divided by a number of all the materials that need to be transferred to the process tank.

10 Claims, 4 Drawing Sheets

(56) References Cited

FOREIGN PATENT DOCUMENTS

| | | | |
|---|---|---|---|
| CN | 103064380 | A | 4/2013 |
| CN | 103116324 | A | 5/2013 |
| CN | 105182946 | A | 12/2015 |
| CN | 106707991 | A | 5/2017 |
| CN | 109292463 | A | 2/2019 |
| CN | 110632902 | A | 12/2019 |
| EP | 0278774 | A2 | 8/1988 |
| JP | H1045234 | A | 2/1998 |

MATERIAL PROCESSING PATH SELECTION METHOD AND DEVICE

CROSS-REFERENCES TO RELATED APPLICATIONS

This application is a continuation of International Application No. PCT/CN2020/110409, filed on Aug. 21, 2020, which claims priority to Chinese Application No. 201910843955.6 filed on Sep. 6, 2019, the entire content of all of which are incorporated herein by reference.

TECHNICAL FIELD

The present disclosure generally relates to the semiconductor field and, more particularly, to a material processing path selection method and a device.

BACKGROUND

During a plurality of processes, such as cleaning, etching, and atmospheric pressure physical vapor deposition (APCVD), in a manufacturing process of semiconductor elements, processing apparatuses are configured to continuously process a plurality of materials simultaneously. How to arrange a transportation sequence of the plurality of materials and a time length of performing a process at each process position of process tanks are key factors to increase a yield of a processing apparatus. Arrangement of the transportation sequence of the plurality of materials and the time length of performing the process at each process position of the process tanks is referred to as material route control.

SUMMARY

Embodiments of the present disclosure provide a material processing path selection method. The method includes calculating a plurality of candidate material processing paths, determining a bottleneck process tank, and for each of the plurality of candidate material processing paths, calculating a bottleneck process tank utilization rate to select a candidate material processing path with a highest bottleneck process tank utilization rate in the plurality of candidate material processing paths as a target material processing path. The bottleneck process tank is a process tank having a highest use frequency among all process tanks. A use frequency of the process tank is equal to a total process time length of all materials that need to be transferred to the process tank divided by a number of all the materials that need to be transferred to the process tank. The bottleneck process tank utilization rate is equal to an operation time length of the bottleneck process tank in a current candidate material processing path divided by a process time length of the candidate material path.

Embodiments of the present disclosure provide a material processing path selection device, including a first calculation circuit, a determination circuit, and a second calculation circuit. The first calculation circuit is configured to calculate a plurality of candidate material processing paths. The determination circuit is configured to determine a bottleneck process tank. The bottleneck process tank includes a process tank having a highest use frequency among all process tanks. A use frequency of the process tank is equal to a total process time length of all materials that need to be transferred to the process tank divided by a number of all the materials that need to be transferred to the process tank. The second calculation circuit is configured to, for each of the plurality of candidate material processing paths, calculate a bottleneck process tank utilization rate to select a candidate material processing path with a highest bottleneck process tank utilization rate in the plurality of candidate material processing paths as a target material processing path. The bottleneck process tank utilization rate is equal to an operation time length of the bottleneck process tank in a current candidate material processing path divided by a process time length of the candidate material path.

Embodiments of the present disclosure provide a computer-readable medium. The computer-readable medium stores computer-readable program codes that, when executed by a processor, causes the processor to calculate a plurality of candidate material processing paths, determine a bottleneck process tank, and for each of the plurality of candidate material processing paths, calculate a bottleneck process tank utilization rate to select a candidate material processing path with a highest bottleneck process tank utilization rate in among the plurality of candidate material processing paths as a target material processing path. The bottleneck process tank is a process tank having a highest use frequency in among all process tanks. A use frequency of the process tank is equal to a total process time length of all materials that need to be transferred to the process tank divided by a number of all the materials that need to be transferred to the process tank. The bottleneck process tank utilization rate is equal to an operation time length of the bottleneck process tank in a current candidate material processing path divided by a process time length of the candidate material path.

The material processing path selection method and device of embodiments of the present disclosure may have at least the following advantages.

When the route control is performed in the process of processing the plurality of materials, the target material processing path may be calculated according to the process time length and the bottleneck process tank, that is a bottleneck resource, utilization rate. According to the calculated target material processing path, each of the plurality of materials may be transferred to all the process tanks, where each of the plurality of materials needs to be transferred to complete the processing process for each material. Thus, the processing processes of all the materials may be completed in a short time. The bottleneck resource may be sufficiently used to improve the yield of the processing apparatus.

DETAILED DESCRIPTION OF THE EMBODIMENTS

The present disclosure is further described in detail below in connection with the accompanying drawings and embodiments. Specific embodiments described here are only used to explain the related present disclosure, but not to limit the present disclosure. In addition, to facilitate description, only parts associated with the present disclosure are shown in the accompanying drawings.

When there is no conflict, embodiments and features of embodiments of the present disclosure may be combined with each other. The present disclosure is described in detail in connection with reference to the accompanying drawings and in connection with embodiments.

Figure 1:
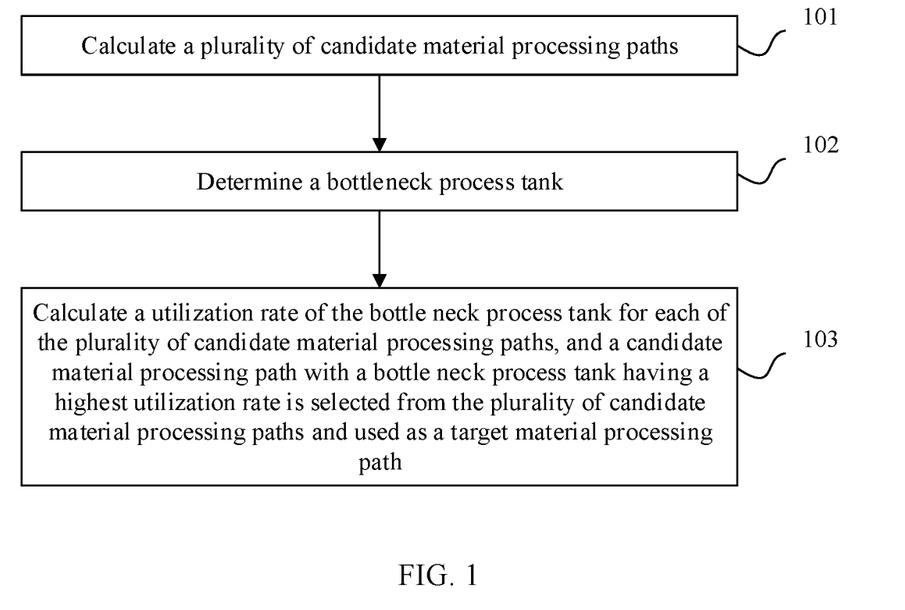
FIG. 1 is a schematic flowchart of a material processing path selection method according to some embodiments of the present disclosure.

FIG. 1 is a schematic flowchart of a material processing path selection method according to some embodiments of the present disclosure. The method includes the following processes.

At 101, a plurality of candidate material processing paths are calculated.

In embodiments of the present disclosure, a cassette carried with wafers may be used as a material for description. Each cassette may include a predetermined number of wafers. For example, each cassette may include 25 wafers. The material of the present disclosure is not limited to the cassette.

In embodiments of the present disclosure, the material processing path may be used to describe, for each cassette of a plurality of cassettes, what time the cassette should be transferred to which process tank, and a time length required for processing the wafers in the cassette after the cassette is transferred to the process tank.

In embodiments of the present disclosure, according to a time length required for transferring each cassette from one process tank to another process tank and the time length required for processing the wafers in the cassette after each cassette is transferred to the process tank, all possible transfer sequences of the plurality of cassettes and all possible start time for transferring each cassette from the one process tank to the another process tank may be calculated. Thus, all candidate material processing paths may be calculated.

For example, when a tank cleaning apparatus is configured to clean the wafers in the cassette, a transfer process of the plurality of cassettes may be as follows. The plurality of cassettes all start from a cassette transfer position. After each cassette of the plurality of cassettes reaches all the process tanks, to which each cassette of the plurality of cassettes should be transferred, the plurality of cassettes are all transferred again back to the cassette transfer position. Each cassette of the plurality of cassettes needs to be transferred to all the process tanks, to which the cassette needs to be transferred. A cleaning-related process may be performed on the wafers of the cassette in the process tank, to which the cassette is transferred to.

In some embodiments, calculating the plurality of candidate material processing paths may include determining processing associated information of each material of all the to-be-transferred materials and calculating the plurality of candidate material processing paths based on the processing associated information of each material. The processing associated information of a material may indicate all process tanks that the material needs to be transferred to and a transfer sequence.

In embodiments of the present disclosure, according to all the process tanks that the material (e.g., cassette) needs to be transferred to and the transfer sequence, a time length required for transferring each cassette from one process tank to another process tank may be calculated. A time length required for processing the wafers in the cassette may be calculated after each cassette is transferred to the process tank. All possible start time for transferring each cassette from the one process tank to the another process tank may be calculated. That is, from what time that each cassette may be transferred from the one process tank to the another process tank may be calculated. Thus, all the candidate material processing paths may be calculated.

At 102, a bottleneck process tank is determined.

In embodiments of the present disclosure, the bottleneck process tank may be referred to as a bottleneck resource. The bottleneck process tank may be a most frequently used process tank. The use frequency of the process tank may be equal to a total process time length of all materials that need to be transferred to the process tank divided by a number of all the materials that need to be transferred to the process tank.

In embodiments of the present disclosure, the process tank may be referred to as tank, and for each tank, the use frequency f may be defined as follows.

f is equal to a total process time length of all the cassettes that need to be transferred to the tank divided by a number of all the cassettes that need to be transferred to the tank.

In embodiments of the present disclosure, for each process tank, the total process time length of all the cassettes that need to be transferred to the process tank may be equal to a sum of the process time lengths of each of the plurality of cassettes that needs to be transferred to the process tank in the process tank.

For each process tank, the process time length of a cassette that needs to be transferred to the process tank in the process tank may be equal to a time length from the start time of processing all the wafers in the cassette in the process tank to the end time when all the wafers in the cassette are processed.

In some embodiments, determining the bottleneck process tank includes calculating the use frequency of each process tank of all the process tanks. Calculating the use frequency of each process tank of all the process tanks includes the following processes.

An update operation may be performed iteratively until a total process time length of all the materials that need to be transferred to a process tank is determined for each process tank and the number of all the materials that need to be transferred to the process tank is determined.

The total process time length of all the materials that need to be transferred to the process tank may be divided by the number of all the materials that need to be transferred to the process tank to obtain the use frequency of the process tank.

The most frequently used process tank of all the process tanks may be determined as the bottleneck process tank.

Further, in some embodiments, the above update operation may include:

determining whether all the to-be-transferred materials are traversed, traversing all the to-be-transferred materials including visiting each of all the to-be-transferred materials in sequence;

if all the to-be-transferred materials are traversed, determining a current total process time length of the process tank as the total process time length of all the materials that need to be transferred to the process tank, and a number of the current materials as a number of all the materials that need to be transferred to the process tank in the process tank;

if not all the materials are traversed, using a next material of a most recently visited material as a current material to determine whether the current material needs to be transferred to the process tank for processing; if yes, adding a process time length of the current material that needs to be processed in the process tank to the current total process time length of the process tank to obtain a current total process time length of the process tank when a next update operation is executed and adding 1 to the current material number of the process tank to obtain a number of current materials of the process tank when the next update operation is executed; if no, returning to the process of determining whether all the to-be-transferred materials are traversed.

In embodiments of the present disclosure, for any process tank, the total process time length of all the materials that need to be transferred to the process tank may be equal to a sum of the process time length of each of the cassettes that need to be transferred to the process tank in the process tank. For any process tank, the number of all the materials that need to be transferred to the process tank of the process tank may be equal to the number of all the materials that need to be transferred to the process tank.

In embodiments of the present disclosure, for each of all the process tanks, the use frequency of the process tank may be calculated by performing the update operation iteratively.

If all the materials are traversed, the current total process time length of the process tank may be determined as the total process time of all materials that need to be transferred to the process tank. The current material number of the process tank may be determined as the number of all the materials that need to be transferred to the process tank. The update operation may no longer be performed.

In other words, when the use frequency of a process tank is calculated, the update operation may be iteratively performed until the total process time length of all the materials that need to be transferred to the process tank, and the number of all the materials that need to be transferred to the process tank. The update operation may be then stopped being performed.

In embodiments of the present disclosure, after the use frequency of each of the process tanks is calculated, the process tank with the highest use frequency of all the process tanks may be determined as the bottleneck process tank.

Figure 2:
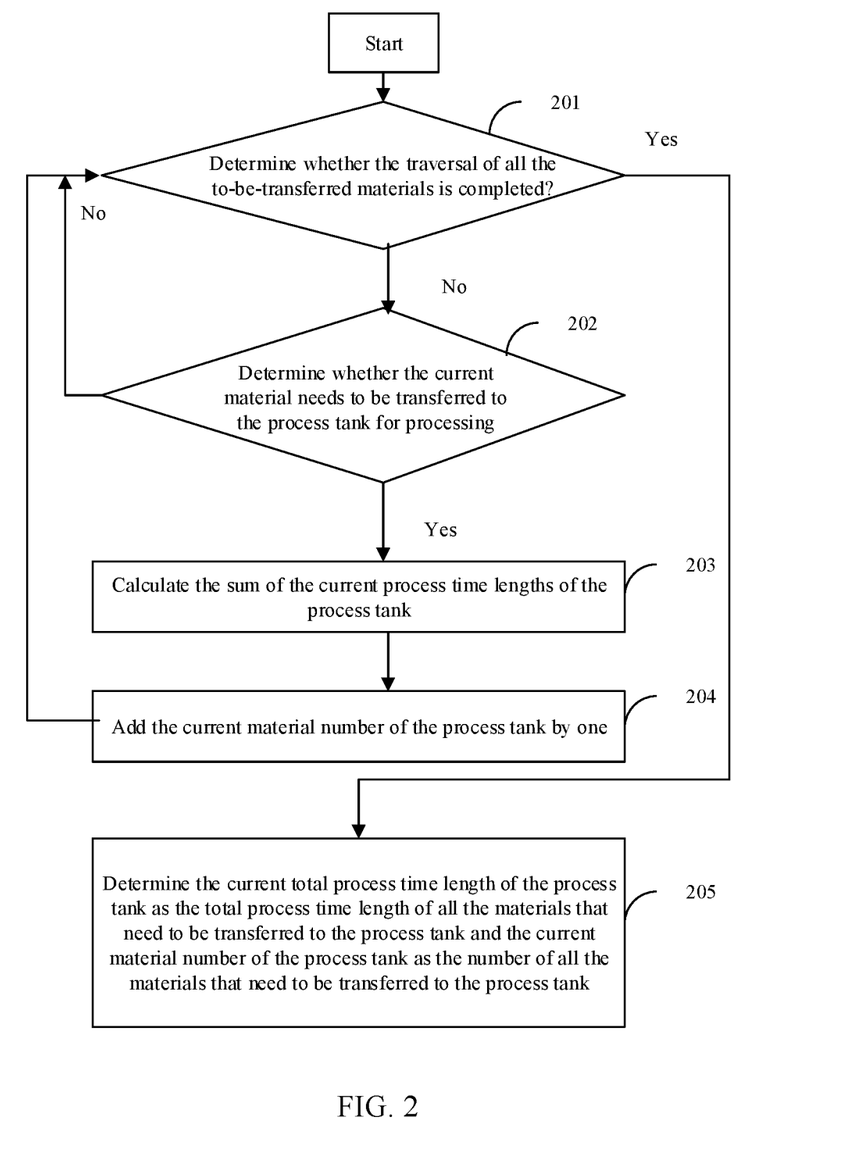
FIG. 2 is a schematic flowchart of calculation of a use frequency of a process tank according to some embodiments of the present disclosure.

FIG. 2 is a schematic flowchart of calculation of a use frequency of a process tank according to some embodiments of the present disclosure.

At 201, whether all the to-be-transferred materials are traversed is determined. Traversing all the to-be-transferred materials includes visiting each of all the to-be-transferred materials. If all the to-be-transferred materials are traversed, process 205 is executed. If not all the to-be-transferred materials are traversed, process 202 may be executed.

At 202, whether the current material needs to be transferred to the process tank for processing is determined. The current material may be a next material of a most recently visited material. If the current material needs to be transferred to the process tank for processing, process 203 may be executed. If the current material does not need to be transferred to the process tank for processing, the process may return to process 201.

At 203, the sum of the current process time lengths of the process tank is calculated.

The process time length required for processing the current material in the process tank may be added to the current total process time length of the process tank to obtain the current total process time length of the process tank when process 203 is executed again. That is, the current total process time length may be the sum of the total process time lengths.

At 204, the current material number of the process tank is added by 1. The current material number of the process tank is added by 1 to obtain the current material number of the process tank when process 204 is executed next time.

At 205, the current total process time length of the process tank is determined as the total process time length of all the materials that need to be transferred to the process tank, and the current material number of the process tank is determined as the number of all the materials that need to be transferred to the process tank. The total process time length of all the materials that need to be transferred to the process tank in the process tank may be divided by the number of all the materials that need to be transferred to the process tank to obtain the use frequency of the process tank.

At 103, a utilization rate of the bottleneck process tank is calculated for each of the plurality of candidate material processing paths, and a candidate material processing path with a bottleneck process tank having a highest utilization rate is selected from the plurality of candidate material processing paths and used as a target material processing path.

In embodiments of the present disclosure, for each candidate material processing path, the bottleneck process tank utilization rate of the candidate material processing path may be equal to dividing an operation time length of the bottleneck process tank corresponding to the candidate material processing path by the process time length of the candidate material processing path. That is, the bottleneck process tank utilization rate of the candidate material processing path=the operation time length of the bottleneck process tank corresponding to the candidate material processing path/the process time length of the candidate material processing path.

In embodiments of the present disclosure, the process time length of the candidate material processing path may be a time length required to complete processing processes of all the cassettes by using the candidate material processing path.

For example, the processing of the plurality of cassettes may be as follows. When a tank cleaning apparatus is configured to perform cleaning on the wafers in the plurality of cassettes, the plurality of cassettes all start from the cassette transfer position. After the plurality of cassettes are transferred to all the process tanks, the plurality of cassettes may be transferred back to the cassette transfer position again. The process time length of the candidate material processing path may be the time length required for processing the plurality of cassettes.

In embodiments of the present disclosure, the operation time length of the bottleneck process tank corresponding to the candidate material processing path may include an accumulated time length of the bottleneck process tank being in a processing status for the wafers in the cassettes when all the cassettes are processed by using the candidate material processing path.

In some embodiments, for each of the plurality of candidate material processing paths, calculating the bottleneck process tank utilization rate and selecting the candidate material processing path having a largest bottleneck process tank utilization rate from the plurality of candidate material processing paths as the target material processing path includes:

for each of the plurality of candidate material processing paths, dividing the operation time length of the bottleneck process tank in the candidate material processing path by the process time length of the candidate material processing path to obtain the bottleneck process tank utilization rate of the candidate material processing path; and performing a path calculation operation iteratively until the target material processing path is determined.

The path calculation operation includes:

determining whether traversal of all candidate material processing paths is completed, the traversal of all the candidate material processing paths including visiting each of all the candidate material processing paths;

if the traversal of all the candidate material processing paths is completed, determining a current optimal path as the above-mentioned target material processing path, the optimal path being a path with the current highest bottleneck process tank utilization rate; and if the traversal of all the candidate material processing paths is not completed, using a next candidate material processing path of a latest visited candidate material processing path as the current path; determining whether a bottleneck process tank utilization rate of the current path is greater than a maximum value of the current bottleneck process tank utilization rate; if yes, using the bottleneck process tank utilization rate of the current path as the maximum value of the current bottleneck process tank utilization rate when the next path calculation operation is performed, using the current path as the current optimal path when the next path calculation operation is performed, and using the path time length of the current path as the shortest time length of the current path when the next path calculation operation is performed, the path time length of the current path being the process time length of the current path; if no, determining whether the bottleneck process tank utilization rate of the current path is equal to the maximum value of the current bottleneck process tank utilization rate, and if the bottleneck process tank utilization rate of the current path is not equal to the maximum value of the current bottleneck process tank utilization rate, returning to the process of determining whether all candidate material processing paths are completed, if the bottleneck process tank utilization rate of the current path is equal to the maximum value of the current bottleneck process tank utilization rate, determining whether the path time length of the current path is less than the shortest path time length of the current path. If the path time length of the current path is greater than or equal to the shortest time length of the current path, the process may return to determine whether the traversal of all the candidate material processing paths is completed. If the path time length of the current path is shorter than the shortest time length of the current path, the bottleneck process tank utilization rate of the current path may be used as the maximum value of the current bottleneck process tank utilization rate when the next path calculation operation is performed. The current path may be used as the current optimal path when the next path calculation operation is performed. The current path time length may be used as the shortest current path time length when the next path calculation operation is performed.

Figure 3:
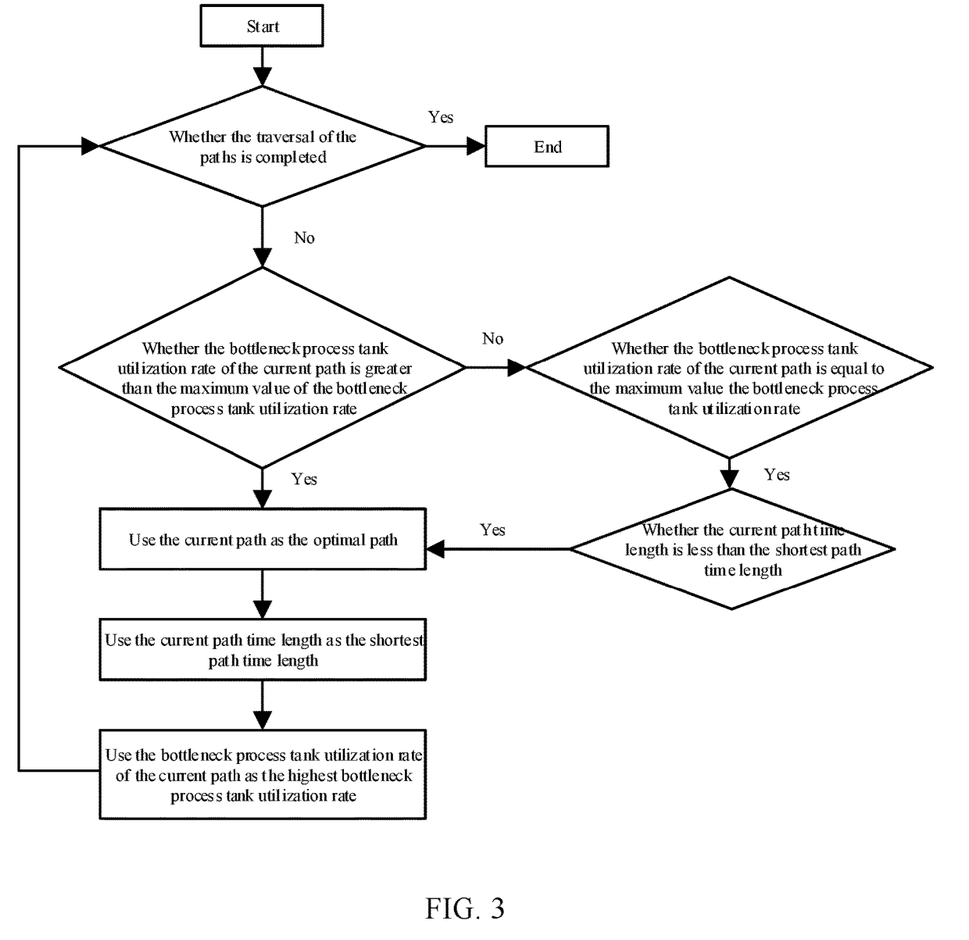
FIG. 3 is a schematic flowchart of calculation of a target material processing path according to some embodiments of the present disclosure.

FIG. 3 is a schematic flowchart of calculation of a target material processing path according to some embodiments of the present disclosure.

When the target material processing path is calculated, the bottleneck process tank utilization rate of each of the candidate material processing paths may be traversed. During a traversal process, each of the candidate material processing paths may be visited. The currently visited candidate material processing path may be referred to as the current path. The process time length of the current path may be referred to as the current path time length.

When a first candidate material processing path is visited, the bottleneck process tank utilization rate of the first candidate material processing path may be used as the maximum value of the current bottleneck process tank utilization rate. The process time length of the first candidate material processing path may be used as the shortest current path time length.

After the first candidate material processing path is visited, when each time a candidate material processing path is visited, the bottleneck process tank utilization rate of the current path may be compared with the maximum value of the current bottleneck process tank utilization rate.

If the bottleneck process tank utilization rate of the current path is greater than the maximum value of the current bottleneck process tank utilization rate, the bottleneck process tank utilization rate of the current path may be used as the maximum value of the current bottleneck process tank utilization rate. The current path may be used as the current optimal path. The current path time length may be used as the shortest current path time length.

If the bottleneck process tank utilization rate of the current path is not greater than the maximum value of the current bottleneck process tank utilization rate, whether the bottleneck process tank utilization rate of the current path is equal to the maximum value of the current bottleneck process tank utilization rate may be continued to be determined. If the bottleneck process tank utilization rate of the current path is not equal to the maximum value of the current bottleneck process tank utilization rate, that is, the bottleneck process tank utilization rate of the current path is less than the maximum value of the current bottleneck process tank utilization rate, then a next candidate material processing path may be visited. If the bottleneck process tank utilization rate of the current path is equal to the maximum value of the current bottleneck process tank utilization rate, whether the current path time length of the current path is less than the shortest path time length may be continued to be determined. If the current path time length of the current path is not less than the shortest path time length, a next candidate material processing path may be visited. If the current path time length of the current path is less than the shortest path time length, the bottleneck process tank utilization rate of the current path may be used as the maximum value of the current bottleneck process tank utilization rate. The current path may be used as the current optimal path. The current path time length may be used as the current shortest path time length.

In embodiments of the present disclosure, when the target material processing path is selected from the plurality of candidate material processing paths based on the bottleneck process tank utilization rate of each of the plurality of candidate material processing paths, the bottleneck process tank utilization rates of all the candidate material processing paths may be sorted from high to low. The candidate material processing path with the highest bottleneck process tank utilization rate of the plurality of candidate material processing paths may be used as the target material processing path.

In some embodiments, the target material processing path is selected from the plurality of candidate material processing paths based on the bottleneck process tank utilization rate of each of the plurality of candidate material processing paths. When multiple candidate material processing paths have the highest bottleneck process tank utilization rate, the candidate material processing path with the shortest process time length may be determined from the multiple candidate material processing paths with the highest bottleneck process tank utilization rate. The candidate material processing path with the shortest process time length may be used as the target material processing path.

In embodiments of the present disclosure, after the target material processing path is determined, each of the plurality of cassettes may be transferred to all the process tanks that the cassette needs to be transferred to according to the target material processing path. Thus, the processing process of each material may be completed.

For example, the processing process of the plurality of cassettes may be as follows. When the tank cleaning apparatus is configured to clean the wafers in the cassettes, the plurality of cassettes may all start from the cassette transfer position. After each of the plurality of cassettes is transferred to all the process tanks, each of the plurality of cassettes may be transferred back to the cassette transfer position again. Each of the plurality of cassettes may be transferred to all the process tanks that each of the plurality of cassettes should be transferred to according to the target material processing path. Thus, the processing process of each of the plurality of cassettes may be completed.

Figure 4:
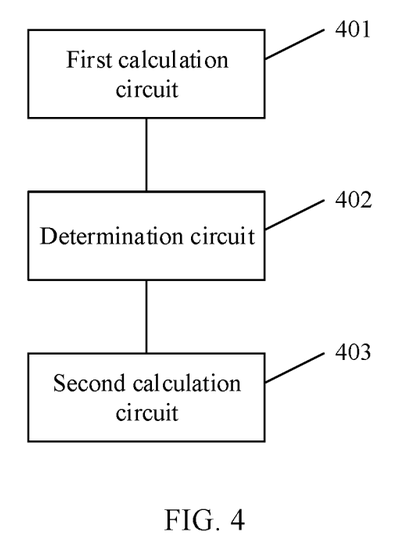
FIG. 4 is a schematic structural diagram of a material processing path selection device according to some embodiments of the present disclosure.

FIG. 4 is a schematic structural diagram of a material processing path selection device according to some embodiments of the present disclosure. For specific implementation of operations performed by units in the material processing path selection device, reference may be made to the specific implementation manner of the corresponding operations described in the above-mentioned reference method embodiment.

As shown in FIG. 4, the material processing path selection device of embodiments of the present disclosure is mounted in an electronic apparatus. The material processing path selection device includes a first calculation circuit 401, a determination circuit 402, and a second calculation circuit 403.

The first calculation circuit 401 may be configured to calculate the plurality of candidate material processing paths.

The determining circuit 402 may be configured to determine the bottleneck process tank. The bottleneck process tank may be the most frequently used process tank of all the process tanks. The use frequency of the process tank may be equal to the total process time length of all materials that need to be transferred to the process tank divided by the number of all the materials that need to be transferred to the process tank.

The second calculation circuit 403 may be configured to calculate the bottleneck process tank utilization rate of each of the plurality of candidate material processing paths, and select the candidate material processing path with the highest bottleneck process tank utilization rate from the plurality of candidate material processing paths as the target material processing path. The bottleneck process tank utilization rate may be equal to the operation time length of the bottleneck process tank in the current candidate material processing path divided by the process time length of the candidate material processing path.

In some embodiments, the second calculation circuit 403 may be further configured to, when a number of candidate material processing paths with the highest bottleneck process tank utilization rate of the plurality of candidate material processing paths is multiple, select a candidate material processing path with the shortest operation time length from the multiple candidate material processing paths with the highest bottleneck processing tank utilization rate as the target material processing path.

In some embodiments, the determination circuit 402 may be further configured to, calculating the use frequency of each of all the process tanks may include performing the update operation iteratively until, for each process tank, the total process time length of all materials that need to be transferred to the process tank and the number of all the materials that need to be transferred to the process tank are determined and dividing the total process time length of all the materials that need to be transferred to the process tank by the number of all the materials that need to be transferred to the process tank to obtain the use frequency of the process tank. The above update operation may include the following processes. Whether the traversal of all the to-be-transferred materials is completed may be determined. The traversal of all the to-be-transferred materials includes sequentially visiting each of all the to-be-transferred materials. If the above traversal is completed, the current total process time length of the process tank may be determined as the total process time length of all the materials that need to be transferred to the process tank, and the current material number of the process tank may be determined as the number of all the materials that need to be transferred to the process tank. If the above traversal is not completed, the next material of the most recently visited material may be used as the current material. Then, whether the current material needs to be transferred to this process tank for processing may be determined. If yes, the process time length required for processing the current material in the process tank may be added to the current total process time length of the process tank to obtain the current total process time length of the process tank when the next update operation is performed. The current material number of the process tank may be added by 1 to obtain the current material number of the process tank when the next update operation is performed. If not, the update operation may return to the process of determining whether the traversal of all the to-be-transferred materials is completed. The determination circuit 402 may be further configured to determine the process tank with the highest use frequency of all the process tanks as the bottleneck process tank.

In some embodiments, the second calculation circuit 403 may be further configured to, for each candidate material processing path, divide the operation time length of the bottleneck process tank in the candidate material processing path by the process time length of the candidate material processing path to obtain the bottleneck process tank utilization rate of the candidate material processing path and perform the path calculation operation iteratively until the target material processing path is determined.

The path calculation operation may include the following processes.

Whether the traversal of all the candidate material processing paths is completed may be determined. The traversal of all the candidate material processing paths may include sequentially visiting each of all the candidate material processing paths.

If the traversal of all the candidate material processing paths is completed, the current optimal path may be determined as the target material processing path. The optimal path may be the path with the highest bottleneck process tank utilization rate.

If the traversal of all the candidate material processing paths is not completed, the next candidate material processing path of the most recently visited candidate material processing path may be used as the current path. Whether the bottleneck process tank utilization rate of the current path is greater than the maximum value of the current bottleneck process tank utilization rate may be determined. If yes, the bottleneck process tank utilization rate of the current path may be used as the maximum value of the current bottleneck process tank utilization rate when the next path calculation operation is performed. The current path may be used as the current optimal path when the next path calculation operation is performed. The path time length of the current path may be used as the shortest current path time length when the next path calculation operation is performed. The path time length of the current path may be the process time length of the current path.

If the bottleneck process tank utilization rate of the current path is not greater than the maximum value of the current bottleneck process tank utilization rate, whether the bottleneck process tank utilization rate of the current path is equal to the maximum value of the current bottleneck process tank utilization rate may be determined. If the bottleneck process tank utilization rate of the current path is not equal to the maximum value of the current bottleneck process tank utilization rate, the operation may return to the process of determining whether the traversal of all the candidate material processing paths is completed. If the bottleneck process tank utilization rate of the current path is equal to the maximum value of the current bottleneck process tank utilization rate, whether the path time length of the current path is less than the shortest current path time length may be determined. If the path time length of the current path is greater than or equal to the shortest current path time length, the operation may return to the process of determining whether the traversal of all the candidate material processing paths is completed. If the path time length of the current path is less than the shortest current path time length, the bottleneck process tank utilization rate of the current path may be used as the maximum value of the current bottleneck process tank utilization rate when the next path calculation operation is performed. The current path may be used as the current optimal path when the next path calculation operation is performed. The path time length of the current path may be used as the shortest current path time length when the next path calculation operation is performed.

In some embodiments, the first calculation circuit 401 may be further configured to determine the processing associated information of each of all the to-be-transferred materials and calculate the plurality of candidate material processing paths based on the processing associated information of each of all the to-be-transferred materials. The processing associated information of the material may indicate all the process tanks to which the material needs to be transferred and the transfer sequence.

The present disclosure further provides an electronic apparatus. The electronic apparatus may include one or more processors and a memory used to store one or more programs. The one or more programs may include instructions used to perform the operation described in embodiments of the present disclosure. When the one or more programs are executed by the one or more processors, the one or more processors may be caused to execute the instructions of the operations described in embodiments of the present disclosure.

The present disclosure further provides a computer-readable medium. The computer-readable medium may be included in the electronic apparatus or may exist alone and may not be mounted into the electronic apparatus. The computer-readable medium may carry one or more programs that, when the one or more programs are executed by the electronic apparatus, cause the electronic apparatus to perform the operations described in embodiments of the present disclosure.

The computer-readable medium described in the present disclosure may be a computer-readable signal medium, a computer-readable storage medium, or any combination thereof. The computer-readable storage medium may include, but is not limited to, an electrical, magnetic, optical, electromagnetic, infrared, or semiconductor system, apparatus, or device, or any combination thereof. For example, the computer-readable storage medium may include, but is not limited to an electrical connection with one or more wires, portable computer magnetic disks, hard disks, random access memory (RAM), read-only memory (ROM), erasable programmable read-only memory (EPROM or flash memory), optical fiber, portable compact disk read-only memory (CD-ROM), an optical storage device, a magnetic storage device, or any suitable combination thereof. In the present disclosure, the computer-readable storage medium can be any tangible medium that includes or stores a program. The program can be used by or in combination with a message execution system, apparatus, or device. In the present disclosure, the computer-readable signal medium may include a data signal propagated in a baseband or as a part of a carrier wave, which carries computer-readable program codes. The propagated data signal may include various forms, including but not limited to an electromagnetic signal, an optical signal, or any suitable combination thereof. The computer-readable signal medium may also include any computer-readable medium other than the computer-readable storage medium. The computer-readable medium may send, propagate, or transmit the program that is use by or in combination with the message execution system, apparatus, or device. The program codes included in the computer-readable medium may be transmitted by any suitable medium, including but not limited to wireless, wired, optical cable, radiofrequency (RF), or any suitable combination thereof.

The flowcharts and block diagrams in the accompanying drawings illustrate the system architecture, functions, and operations which may be implemented by the system, method, and computer program product according to various embodiments of the present disclosure. Each block in the flowcharts or block diagrams may represent a module, a program segment, or a part of codes. The module, the program segment, or the part of the codes may include one or more executable messages for realizing the specified logical function. In some alternative implementations, the functions marked in the block may also executed in an order different from the order marked in the accompanying drawings. For example, two blocks shown in next to each other may actually be executed in parallel or may sometimes be executed in the reverse order, which depends on the function involved. Each block and the combination of the blocks in the block diagram and/or flowchart may be implemented by a dedicated hardware-based system that performs the specified function or operations or by a combination of dedicated hardware and the computer message.

Only preferred embodiments of the present disclosure and an explanation of the applied technical principle are described above. Those skilled in the art should understand that the scope of the present disclosure is not limited to technical embodiments formed by the specific combinations of the above technical features, and should also cover other technical embodiments formed by any combination of the technical features or equivalent features without departing from the concept of the present disclosure. For example, the features and the technical features disclosed in the present disclosure (but not limited to) having similar functions may be replaced by each other to form a technical embodiment.

What is claimed is:

1. A material processing path selection method performed by a hardware processor, comprising:
   calculating a plurality of candidate material processing paths;
   determining a bottleneck process tank, the bottleneck process tank being a process tank having a highest use frequency among all process tanks, a use frequency of the process tank being equal to a total process time length of all materials that need to be transferred to the process tank divided by a number of all the materials that need to be transferred to the process tank;
   for each of the plurality of candidate material processing paths, calculating a bottleneck process tank utilization rate to select a candidate material processing path with a highest bottleneck process tank utilization rate among the plurality of candidate material processing paths as a target material processing path, the bottleneck process tank utilization rate being equal to an operation time length of the bottleneck process tank in a current candidate material processing path divided by a process time length of the candidate material path; and
   transferring each material of all the materials to an available process tank till all available process tanks are used for processing, according to the calculated target material processing path.

2. The method according to claim 1, wherein selecting the candidate material processing path with the highest bottleneck process tank utilization rate among the plurality of candidate material processing paths as the target material processing path includes:
   in response to two or more candidate material processing paths having the highest bottleneck process tank utilization rate in the plurality of candidate material processing paths, selecting a candidate material processing path with a shortest process time length from the two or more candidate material processing paths having the highest bottleneck process tank utilization rate as the target material processing path.

3. The method according to claim 2, wherein determining the bottleneck process tank includes:
   calculating the use frequency of each of all the process tanks, including:
      performing an update operation iteratively until, for each process tank, the total process time length of all the materials that need to be transferred to the process tank is determined, and the number of all the materials that need to be transferred to the process tank is determined; and
      dividing the total process time length of all the materials that need to be transferred to the process tank by the number of all the materials that need to be transferred to the process tank to obtain the use frequency of the process tank, the update operation including:
         determining whether a traversal of all to-be-transferred materials is completed, the traversal of all the to-be-transferred materials including visiting each of all the to-be-transferred materials;
         in response to the traversal being completed, determining a current total process time length of the process tank as the total process time length of all the materials that need to be transferred to the process tank and a current material number of the process tank as the number of all the materials that need to be transferred to the process tank;
         in response to the traversal being not completed, using a next material of a most recently visited material as a current material, and determining whether the current material needs to be transferred to the process tank for processing;
         in response to the current material needs to be transferred to the process tank for processing, adding a process time length required for processing the current material in the process tank with the current total process time length of the process tank to obtain the current total process time length of the process tank when a next update operation is performed and adding the current material number of the process tank by one to obtain the current material number of the process tank when the next update operation is performed; and
         in response to the current material does not need to be transferred to the process tank for processing, returning to determine whether the traversal of all the to-be-transferred materials is completed; and
   determining a process tank with a highest use frequency of all the process tanks as the bottleneck process tank.

4. The method according to claim 3, wherein for each of the plurality of candidate material processing paths, calculating the bottleneck process tank utilization rate to select the candidate material processing path with the highest bottleneck process tank utilization rate from the plurality of candidate material processing paths as the target material processing path includes:
   for each of the plurality of candidate material processing paths, dividing an operation time length of the bottleneck process tank in the candidate material processing path by the process time length of the candidate material processing path to obtain the bottleneck process tank utilization rate of the candidate material processing path; and
   performing a path calculation operation iteratively until the target material processing path is determined, the path calculation operation including:
      determining whether a traversal of all the candidate material processing paths is completed, the traversal of all the candidate material processing paths including visiting each of all the candidate material processing paths in sequence;
      in response to the traversal of all the candidate material processing paths being completed, determining a current optimal path as the target material processing path, the optical path being a path with the current highest bottleneck process tank utilization rate; and
      in response to the traversal of all the candidate material processing path being not completed using a next candidate material processing path of a most recently visited candidate material processing path as the current path and determining whether the bottleneck process tank utilization rate of the current path is greater than a maximum value of the current bottleneck process tank utilization rate;
      in response to the bottleneck process tank utilization rate of the current path being greater than a maximum value of the current bottleneck process tank utilization rate, using the bottleneck process tank utilization rate of the current path as the maximum value of the current bottleneck process tank utilization rate when a next path calculation operation is performed, using the current path as the current optimal path when the next path calculation operation is performed, and using a path time length of the current path as a current shortest path time length when the next path calculation operation is performed, the path time length of the current path being the process time length of the current path;

in response to the bottleneck process tank utilization rate of the current path being not greater than a maximum value of the current bottleneck process tank utilization rate, determining whether the bottleneck process tank utilization rate of the current path is equal to the maximum value of the current bottleneck process tank utilization rate;

in response to the bottleneck process tank utilization rate of the current path being not equal to the maximum value of the current bottleneck process tank utilization rate, returning to determine whether the traversal of all the candidate material processing paths is completed;

in response to the bottleneck process tank utilization rate of the current path being equal to the maximum value of the current bottleneck process tank utilization rate, determining whether the path time length of the current path is less than the current shortest path time length;

in response to the path time length of the current path being greater than or equal to the current shortest path time length, returning to determine whether the traversal of all the candidate material processing paths is completed;

in respond to the path time length of the current path being less than the current shortest path time length, using the bottleneck process tank utilization rate of the current path as the maximum value of the current bottleneck process tank utilization rate when the next path calculation operation is performed, using the current path as the current optimal path when the next path calculation operation is performed, and using the path time length of the current path as the current shortest path time length when the next path calculation operation is performed.

5. The method according to claim 4, wherein calculating the plurality of candidate material processing paths includes:
determining processing associated information of each of all the to-be-transferred materials, the associated information of the material indicating all process tanks that the material needs to be transferred to and a transfer sequence; and
calculating the plurality of candidate material processing paths based on the processing associated information of each material.

6. A material processing path selection device comprising:
a memory for storing programs, and
a processor coupled to the memory and, when the programs being executed, configured to:
calculate a plurality of candidate material processing paths;
determine a bottleneck process tank, the bottleneck process tank including a process tank having a highest use frequency among all process tanks, and a use frequency of the process tank being equal to a total process time length of all materials that need to be transferred to the process tank divided by a number of all the materials that need to be transferred to the process tank;
for each of the plurality of candidate material processing paths, calculate a bottleneck process tank utilization rate to select a candidate material processing path with a highest bottleneck process tank utilization rate among the plurality of candidate material processing paths as a target material processing path, the bottleneck process tank utilization rate being equal to an operation time length of the bottleneck process tank in a current candidate material processing path divided by a process time length of the candidate material path; and
transfer each material of all the materials to an available process tank till all available process tanks are used for processing, according to the calculated target material processing path.

7. The device according to claim 6, wherein the processor is further configured to:
in response to two or more candidate material processing paths having the highest bottleneck process tank utilization rate among the plurality of candidate material processing paths, select a candidate material processing path with a shortest process time length from the two or more candidate material processing paths having the highest bottleneck process tank utilization rate as the target material processing path.

8. The device according to claim 7, wherein the processor is further configured to:
calculate the use frequency of each of all the process tanks, including:
performing an update operation iteratively until, for each process tank, the total process time length of all the materials that need to be transferred to the process tank is determined, and the number of all the materials that need to be transferred to the process tank is determined; and
dividing the total process time length of all the materials that need to be transferred to the process tank by the number of all the materials that need to be transferred to the process tank to obtain the use frequency of the process tank, the update operation including:
determining whether a traversal of all to-be-transferred materials is completed, the traversal of all the to-be-transferred materials including visiting each of all the to-be-transferred materials;
in response to the traversal being completed, determining a current total process time length of the process tank as the total process time length of all the materials that need to be transferred to the process tank and a current material number of the process tank as the number of all the materials that need to be transferred to the process tank;
in response to the traversal being not completed, using a next material of a most recently visited material as a current material, and determining whether the current material needs to be transferred to the process tank for processing;
in response to the current material needs to be transferred to the process tank for processing, adding a process time length required for processing the current material in the process tank with the current total process time length of the process tank to obtain the current total process time length of the process tank when a next update operation is performed and adding the current material number of the process tank by one to obtain the current material number of the process tank when the next update operation is performed; and
in response to the current material does not need to be transferred to the process tank for processing, returning to determine whether the traversal of all the to-be-transferred materials is completed; and determine a process tank with a highest use frequency of all the process tanks as the bottleneck process tank.

9. The device according to claim 8, wherein the processor is further configured to:

for each of the plurality of candidate material processing paths, divide an operation time length of the bottleneck process tank in the candidate material processing path by the process time length of the candidate material processing path to obtain the bottleneck process tank utilization rate of the candidate material processing path; and perform a path calculation operation iteratively until the target material processing path is determined, the path calculation operation including:

determining whether a traversal of all the candidate material processing paths is completed, the traversal of all the candidate material processing paths including visiting each of all the candidate material processing paths in sequence;

in response to the traversal of all the candidate material processing paths being completed, determining a current optimal path as the target material processing path, the optical path being a path with the current highest bottleneck process tank utilization rate; and in response to the traversal of all the candidate material processing path being not completed using a next candidate material processing path of a most recently visited candidate material processing path as the current path and determining whether the bottleneck process tank utilization rate of the current path is greater than a maximum value of the current bottleneck process tank utilization rate;

in response to the bottleneck process tank utilization rate of the current path being greater than a maximum value of the current bottleneck process tank utilization rate, using the bottleneck process tank utilization rate of the current path as the maximum value of the current bottleneck process tank utilization rate when a next path calculation operation is performed, using the current path as the current optimal path when the next path calculation operation is performed, and using a path time length of the current path as a current shortest path time length when the next path calculation operation is performed, the path time length of the current path being the process time length of the current path;

in response to the bottleneck process tank utilization rate of the current path being not greater than a maximum value of the current bottleneck process tank utilization rate, determining whether the bottleneck process tank utilization rate of the current path is equal to the maximum value of the current bottleneck process tank utilization rate;

in response to the bottleneck process tank utilization rate of the current path being not equal to the maximum value of the current bottleneck process tank utilization rate, returning to determine whether the traversal of all the candidate material processing paths is completed;

in response to the bottleneck process tank utilization rate of the current path being equal to the maximum value of the current bottleneck process tank utilization rate, determining whether the path time length of the current path is less than the current shortest path time length;

in response to the path time length of the current path being greater than or equal to the current shortest path time length, returning to determine whether the traversal of all the candidate material processing paths is completed;

in respond to the path time length of the current path being less than the current shortest path time length, using the bottleneck process tank utilization rate of the current path as the maximum value of the current bottleneck process tank utilization rate when the next path calculation operation is performed, using the current path as the current optimal path when the next path calculation operation is performed, and using the path time length of the current path as the current shortest path time length when the next path calculation operation is performed.

10. The device according to claim 9, wherein the processor is further configured to:

determine processing associated information of each of all the to-be-transferred materials, the associated information of the material indicating all process tanks that the material needs to be transferred to and a transfer sequence; and calculate the plurality of candidate material processing paths based on the processing associated information of each material.

* * * * *